United States Patent
Nishikawa et al.

(10) Patent No.: US 11,520,226 B2
(45) Date of Patent: Dec. 6, 2022

(54) IMPRINT METHOD, IMPRINT APPARATUS, IMPRINT SYSTEM, AND METHOD OF MANUFACTURING ARTICLE

(71) Applicant: CANON KABUSHIKI KAISHA, Tokyo (JP)

(72) Inventors: Tadayasu Nishikawa, Oyama (JP); Tsutomu Hashimoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 437 days.

(21) Appl. No.: 15/974,199

(22) Filed: May 8, 2018

(65) Prior Publication Data
US 2018/0329293 A1 Nov. 15, 2018

(30) Foreign Application Priority Data
May 12, 2017 (JP) .............................. JP2017-095845
Mar. 20, 2018 (JP) .............................. JP2018-052920

(51) Int. Cl.
G03F 7/00 (2006.01)
H01L 21/027 (2006.01)
C03B 25/02 (2006.01)

(52) U.S. Cl.
CPC .......... *G03F 7/0002* (2013.01); *C03B 25/025* (2013.01); *H01L 21/0271* (2013.01)

(58) Field of Classification Search
None
See application file for complete search history.

(56) References Cited

U.S. PATENT DOCUMENTS

| 8,394,282 B2 | 3/2013 | Panga et al. |
| 8,808,808 B2 | 8/2014 | Xu et al. |
| 9,415,418 B2 | 8/2016 | Sreenivasan et al. |

(Continued)

FOREIGN PATENT DOCUMENTS

| JP | 2007081117 A | 3/2007 |
| JP | 2013074016 A | 4/2013 |

(Continued)

OTHER PUBLICATIONS

Office Action issued in Korean Appln. No. 10-2018-0051015 dated Sep. 24, 2020. English translation provided.

*Primary Examiner* — James M Mellott
(74) *Attorney, Agent, or Firm* — Rossi, Kimms & McDowell LLP

(57) ABSTRACT

The present invention provides an imprint method of performing a forming process which includes supplying an imprint material on a substrate and then forming a pattern of the imprint material on the substrate by using a mold, the method comprising: dispensing, on the substrate, an adhesion material to bring the substrate and the imprint material into tight contact with each other; performing a first annealing process of heating and cooling the substrate on which the adhesion material has been dispensed; conveying the substrate to which the first annealing process has been performed; performing a second annealing process of heating and cooling the substrate which has been conveyed in the conveying; and performing the forming process on the substrate to which the second annealing process has been performed.

13 Claims, 7 Drawing Sheets

(56) References Cited

U.S. PATENT DOCUMENTS

| | | | | |
|---|---|---|---|---|
| 2005/0260522 | A1* | 11/2005 | Weber | G03F 7/0385 |
| | | | | 430/280.1 |
| 2012/0006703 | A1* | 1/2012 | Khusnatdinov | G01N 21/956 |
| | | | | 206/223 |
| 2015/0014819 | A1* | 1/2015 | Hattori | G03F 7/0002 |
| | | | | 257/618 |
| 2016/0009945 | A1* | 1/2016 | Enomoto | C08F 299/02 |
| | | | | 257/618 |
| 2017/0176853 | A1* | 6/2017 | Cheng | B29C 59/002 |

FOREIGN PATENT DOCUMENTS

| | | | |
|---|---|---|---|
| JP | 5399374 | B2 | 1/2014 |
| JP | 2014189616 | A | 10/2014 |
| JP | 2015023149 | A | 2/2015 |
| JP | 2016154214 | A | 8/2016 |
| WO | 2008127835 | A1 | 10/2008 |

\* cited by examiner

IMPRINT METHOD, IMPRINT APPARATUS, IMPRINT SYSTEM, AND METHOD OF MANUFACTURING ARTICLE

BACKGROUND OF THE INVENTION

Field of the Invention

The present invention relates to an imprint method, an imprint apparatus, an imprint system, and a method of manufacturing an article.

Description of the Related Art

An imprint apparatus that forms an imprint material pattern on a substrate by using a mold has gained attention as one type of mass-lithography apparatuses for semiconductor devices and the like. The imprint apparatus performs an imprint process by supplying an imprint material on a substrate and separating a mold from the imprint material that has been cured in a state in which the mold and the imprint material on the substrate are in contact with each other. As a result, an imprint material pattern can be formed on the substrate.

An adhesion layer for improving the adhesiveness of a substrate and an imprint material is formed in advance on the substrate that is to perform an imprint process (refer to Japanese Patent No. 5399374). An adhesion layer can be formed on the substrate, after a spin coater or the like dispenses an adhesion material on the substrate, by heating (baking) the substrate and then removing a solvent contained in the adhesion material.

Since chemical contamination advances along with the elapse of time in the adhesion layer formed on the substrate, adhesion layer contaminants can increase accordingly, and the spread of the imprint material on the adhesion layer can change. In such a case, the filling of the three-dimensional pattern of the mold with the imprint material will be insufficient in the imprint process, and this can cause a defect in the imprint material pattern formed on the substrate.

SUMMARY OF THE INVENTION

The present invention provides, for example, a technique that is advantageous in accurately forming an imprint material pattern on a substrate.

According to one aspect of the present invention, there is provided an imprint method of performing a forming process which includes supplying an imprint material on a substrate and then forming a pattern of the imprint material on the substrate by using a mold, the method comprising: dispensing, on the substrate, an adhesion material to bring the substrate and the imprint material into tight contact with each other; performing a first annealing process of heating and cooling the substrate on which the adhesion material has been dispensed; conveying the substrate to which the first annealing process has been performed; performing a second annealing process of heating and cooling the substrate which has been conveyed in the conveying; and performing the forming process on the substrate to which the second annealing process has been performed.

Further features of the present invention will become apparent from the following description of exemplary embodiments with reference to the attached drawings.

DESCRIPTION OF THE EMBODIMENTS

Figure 1:
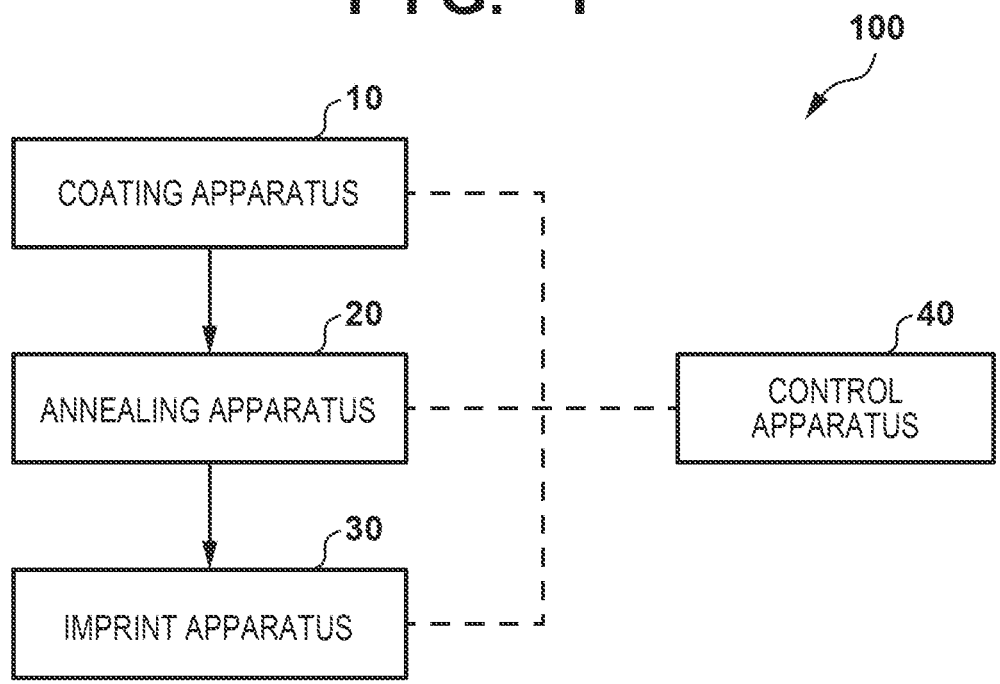
FIG. 1 is a block diagram showing a schematic arrangement of an imprint system.

Exemplary embodiments of the present invention will be described below with reference to the accompanying drawings. Note that the same reference numerals denote the same members throughout the drawings, and a repetitive description thereof will not be given.

First Embodiment

An imprint system 100 according to the first embodiment of the present invention will be described with reference to FIG. 1. FIG. 1 is a block diagram showing the schematic arrangement of the imprint system 100. The imprint system 100 according to this embodiment is a system that forms an imprint material pattern on a substrate, and can include a coating apparatus (a dispensing apparatus) 10, an annealing apparatus 20, and an imprint apparatus 30. Also, a control apparatus 40 that controls, in addition to controlling each of the coating apparatus 10, the annealing apparatus 20, and imprint apparatus 30, the conveyance of a substrate W between the apparatuses is provided in the imprint system 100. The control apparatus 40 can be formed, for example, by a computer that includes a CPU, a storage unit (memory), and the like.

The coating apparatus 10 coats (dispenses), by a spin coater or the like, an adhesion material on the substrate to bring an imprint material and the substrate W into tight contact with each other (to improve adhesiveness between the imprint material and the substrate W). The annealing apparatus 20 performs, on the substrate W that has been coated with the adhesion material by the coating apparatus 10, a first annealing process (first baking process) of heating and cooling the substrate W to remove a solvent contained in the adhesion material. As a result, an adhesion layer that can improve the adhesion between the imprint material and the substrate W can be formed on the substrate. The first annealing process includes a process in which the substrate W is heated to 60° C. or higher (preferably 90° C. or higher), and the heating conditions can be determined arbitrarily in accordance with the type of the adhesion material dispensed on the substrate. The heating conditions can include, for example, heating time, heating temperature, and atmospheric gas ($N_2$, Ar, and the like). The substrate W to which the first annealing process has been performed is stored in a storage case F such as an FOUP (Front Opening Unify Pod). Subsequently, the storage case F as a whole is conveyed to the imprint apparatus 30 by a conveyance mechanism such as an OHT (Overhead Hoist Transfer).

The imprint apparatus 30 is an apparatus that brings the mold and an imprint material supplied on a substrate into contact with each other, and applies curing energy to the imprint material to form a cured product pattern in which the three-dimensional pattern of the mold has been transferred. For example, the imprint apparatus 30 supplies the imprint material on the substrate (on the adhesion layer) and cures the imprint material in a state in which a mold M, on which a three-dimensional pattern is formed, has been brought into contact with the imprint material on the substrate. Subsequently, by increasing the space between the mold M and the substrate W to separate (release) the mold M from the cured imprint material, an imprint material pattern is formed on the substrate (adhesion layer). Such a process may be referred to as a "forming process" or an "imprint process" hereinafter.

A curable composition (to be also referred to as an uncured resin) that is cured by application of curing energy is used as the imprint material. An electromagnetic wave, heat, or the like is used as the curing energy. As the electromagnetic wave, for example, light such as infrared light, visible light, ultraviolet light, or the like whose wavelength is selected from a range of 10 nm (inclusive) to 1 mm (inclusive) is used.

The curable composition is a composition that is cured by light irradiation or application of heat. Of these compositions, a photo-curable composition that is cured by light contains at least a polymerizable compound and a photopolymerization initiator, and may contain a non-polymerizable compound or solvent as needed. The non-polymerizable compound is at least a material selected from a group consisting of a sensitizer, a hydrogen donor, an internal mold release agent, a surfactant, an antioxidant, a polymer component, and the like.

An imprint material may be supplied in a film form onto a substrate by a spin coater or slit coater. Alternatively, an imprint material may be supplied by a liquid ejecting head in a droplet form, an island form with droplets being chained together, or a film form onto a substrate. The viscosity (at 25° C.) of the imprint material is 1 mPa·s (inclusive) to 100 mPa·s (inclusive).

The substrate W is made of glass, a ceramic, a metal, a semiconductor, or a resin. A member formed from a material different from the substrate may be formed on its surface, as needed. More specifically, the substrate W is a silicon wafer, a compound semiconductor wafer, or a silica glass wafer.

Figure 2:
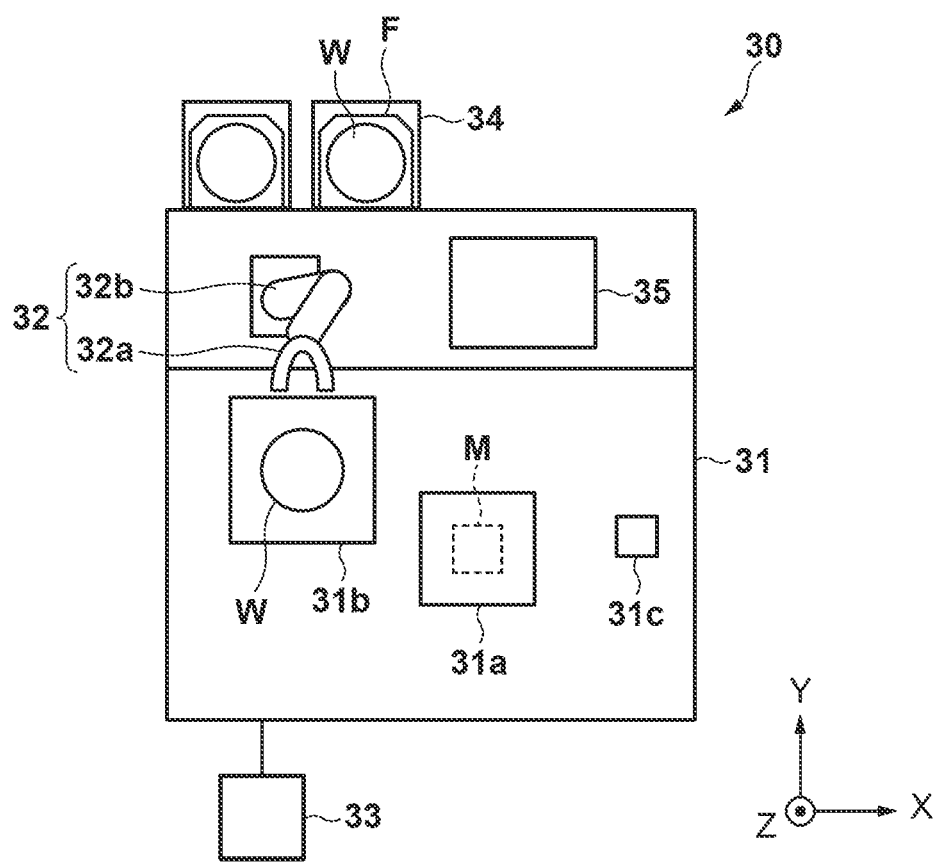
FIG. 2 is a schematic view showing the arrangement of an imprint apparatus according to the first embodiment.

Next, an example of the arrangement of the imprint apparatus 30 will be described. FIG. 2 is a schematic view showing the arrangement of an imprint apparatus 30 according to this embodiment, and is a view in which the imprint apparatus 30 is viewed from above (Z-direction). The imprint apparatus 30 can include a pattern forming unit 31 that performs a forming process, a conveyance unit 32 that conveys the substrate W, and a control unit 33. The control unit 33 controls each unit of the imprint apparatus 30 and is, for example, formed by a computer that includes a CPU and a storage unit (memory). Although the control unit 33 according to this embodiment is formed separately from the control apparatus 40, it may be integrally formed with the control apparatus 40.

The pattern forming unit 31 can include an imprint head 31a that holds the mold M by vacuum chucking, a stage 31b that can move while holding the substrate W by vacuum chucking, and a supply unit 31c that supplies the imprint material onto the substrate which is held by the stage 31b. The conveyance unit 32 has a function of conveying, to the pattern forming unit 31 (onto the stage 31b), the substrate W from the storage case F mounted on a table (mounting table) 34 by a conveyance mechanism such as the OHT. The conveyance unit 32 can be formed by a conveyance robot that includes a hand 32a to hold the substrate W and a driving mechanism 32b (arm) to drive the hand 32a.

Here, in the adhesion layer formed on the substrate, since chemical contamination advances in accordance with the elapse of time, adhesion layer contaminants can increase accordingly, and the way the imprint material spreads on the adhesion layer can change. In this case, in the forming process, the filling of the three-dimensional pattern of the mold M with the imprint material will be insufficient, and this can cause a defect on the imprint material pattern formed on the substrate. As a result of extensive study regarding such a problem, the present inventor has found that the adhesion layer contaminants can be reduced by sublimating the contaminants by performing an annealing process again on the substrate W on which the adhesion layer is formed.

Hence, in the imprint system 100 according to this embodiment, the imprint apparatus 30 includes a annealing unit 35 that performs a second annealing process of heating and cooling the substrate W on which the adhesion layer is formed. For example, a heating oven or the like can be used as the annealing unit 35. In the imprint apparatus 30, after the annealing unit 35 performs the second annealing process on the substrate W on which the adhesion layer has been formed by the first annealing process by the annealing apparatus 20, the substrate W is conveyed to the pattern forming unit 31 for the forming process. As a result, the forming process can be performed in a state in which the contaminants of the adhesion layer have been reduced, and the imprint material pattern can be formed accurately on the substrate.

Figure 3:
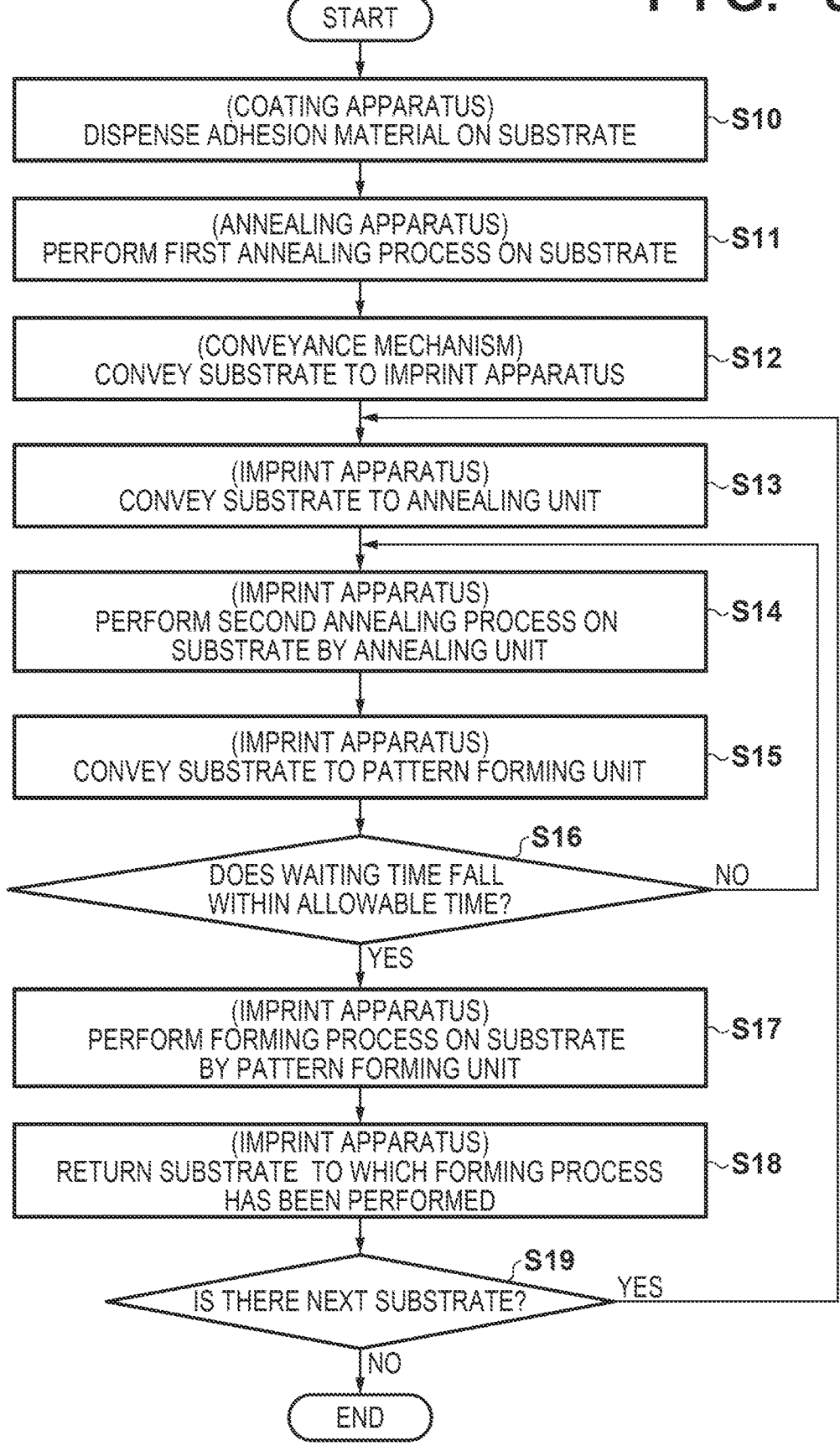
FIG. 3 is a flowchart showing an imprint method according to the first embodiment.

An imprint method of the imprint system 100 according to this embodiment will be described below with reference to FIG. 3. FIG. 3 is a flowchart showing the imprint method of the imprint system according to this embodiment.

In step S10, the coating apparatus 10 dispenses the adhesion material on the substrate. In step S11, the annealing apparatus 20 performs the first annealing process on the substrate W that has been coated with the adhesion material by the coating apparatus 10. The first annealing process is a baking process in which the substrate W is heated to 60° C. or higher (preferably 90° C. or higher) to remove the solvent contained in the adhesion material on the substrate. The adhesion layer can be formed on the substrate by executing this first annealing process. In step S12, the substrate W to which the first annealing process has been performed is conveyed to the imprint apparatus 30 by a conveyance mechanism such as the OHT. More specifically, after performing the first annealing process by the annealing apparatus 20, the substrate W is stored in the storage case F, and the entire storage case F is conveyed onto the table 34 of the imprint apparatus 30 by the conveyance mechanism.

The processes of steps S13 to S19 are processes performed in the imprint apparatus 30 and can be controlled by, for example, the control unit 33.

In step S13, the control unit 33 controls the conveyance unit 32 so that, among the plurality of substrates W stored in the storage case F on the table 34, the substrate W (target substrate W) which is the target of the forming process will be conveyed to the annealing unit 35. In step S14, the control unit 33 controls the annealing unit 35 so as to perform the second annealing process on the target substrate W. The second annealing process is a baking process in which the substrate W is heated to 60° C. or higher (preferably 90° C. or higher) to reduce the contaminants of the adhesion layer formed on the substrate by sublimating the contaminants. Heating conditions in the second annealing process can be arbitrarily determined in accordance with the type of the adhesion material coated on the substrate. However, it may also be determined by changing, among the heating time, heating temperature, and atmospheric gas, at least one of the heating conditions in the first annealing process. For example, since the second annealing process is performed for the removal of adhesion layer contaminants, the heating time of the substrate W can be made shorter than that in the first annealing process which is performed to remove the solvent in the adhesion material.

At this time, in the adhesion layer on the substrate, since chemical contamination will advance with the elapse of time even after the execution of the second annealing process, the adhesion layer contaminants can increase in accordance with the increase in the elapsed time since the end of the second annealing operation by the annealing unit 35. Hence, in step S14, it is preferable for the control unit 33 to control, based on the time at which the forming process is to be started, the timing at which the second annealing process is started by the annealing unit 35 so that the waiting time from the end of the second annealing process until the start of the forming process will fall within an allowable time. The "waiting time from the end of the second annealing process until the start of the forming process" may be simply referred to as "waiting time" hereinafter. Also, the allowable time is the upper-limit of the waiting time in which the defect count of the imprint material pattern formed on the substrate can fall within an allowable range, and the allowable time can be set in advance by performing an experiment or simulation.

In step S15, the control unit 33 controls the conveyance unit 32 so that the substrate W to which the second annealing process has been performed is conveyed to the pattern forming unit 31 (onto the stage 31b). In step S16, the control unit 33 determines whether the waiting time of the substrate W conveyed to the pattern forming unit 31 falls within the allowable time. Here, in step S14, even when the start timing of the second annealing process has been controlled so that the waiting time falls within the allowable time, the waiting time can exceed the allowable time due to, for example, apparatus trouble or the like. Hence, the control unit 33 reconfirms in step S16 whether the waiting time of the substrate W falls within the allowable time. If the waiting time of the substrate W does not fall within an allowable range, the substrate W is conveyed to the annealing unit 35 and the process returns to step S14 to perform the second annealing process again on the substrate W. On the other hand, if the waiting time of the substrate W falls within the allowable range, the process advances to step S17.

In step S17, the control unit 33 controls the pattern forming unit 31 so as to perform the forming process on the substrate W. In step S18, the control unit 33 controls the conveyance unit 32 to return, to the storage case F, the substrate W to which the forming process has been performed. In step S19, the control unit 33 determines whether the substrate W that is to perform the forming process next (to be referred to as the next substrate W hereinafter) is in the storage case F. If the next substrate W is present, the process returns to step S13, and the processes of steps S13 to S19 are performed on the next substrate W. At this time, the second annealing process (steps S13 and S14) on the next substrate W may be performed while the forming processing on the preceding substrate W (the target substrate W) is being performed. On the other hand, if the next substrate W is not present, the process ends.

Here, in a case in which the forming process is to be performed on each of the plurality of substrates W, it is preferable, from the point of reproducibility, to make the plurality of the substrates W have the same defect count of the imprint material pattern formed on the substrate by the forming process. In order to implement this, the same waiting time from the end of the second annealing process until the start of the forming process may be used for the plurality of substrates W. Hence, in the imprint system 100 (imprint apparatus 30) according to this embodiment, the start timing of the second annealing process can be controlled so that the plurality of substrates W will have the same waiting time in step S14.

As described above, in the imprint system 100 according to this embodiment, the annealing unit 35 that performs the second annealing process is arranged in the imprint apparatus 30. In the imprint apparatus 30, after the annealing unit 35 performs the second annealing process on the substrate W on which the adhesion layer has been formed by the execution of the first annealing process by the annealing apparatus 20, the processed substrate W is conveyed to the pattern forming unit 31, and the forming process is performed on the substrate W. As a result, the forming process can be performed in a state in which the adhesion layer contaminants have been reduced, and an imprint material pattern can be accurately formed on the substrate.

Second Embodiment

The imprint system according to the second embodiment of the present invention will be described. Although an imprint system according to this embodiment is a system that has basically inherited the arrangement and the imprint method of the imprint system 100 according to the first embodiment, some parts of the imprint method of this embodiment differ from those in the first embodiment. In the imprint system according to this embodiment, whether a second annealing processing by an annealing unit 35 of an imprint apparatus is to be performed is determined in accordance with the elapse of time since a first annealing process has been performed by an annealing apparatus 20.

Figure 4:
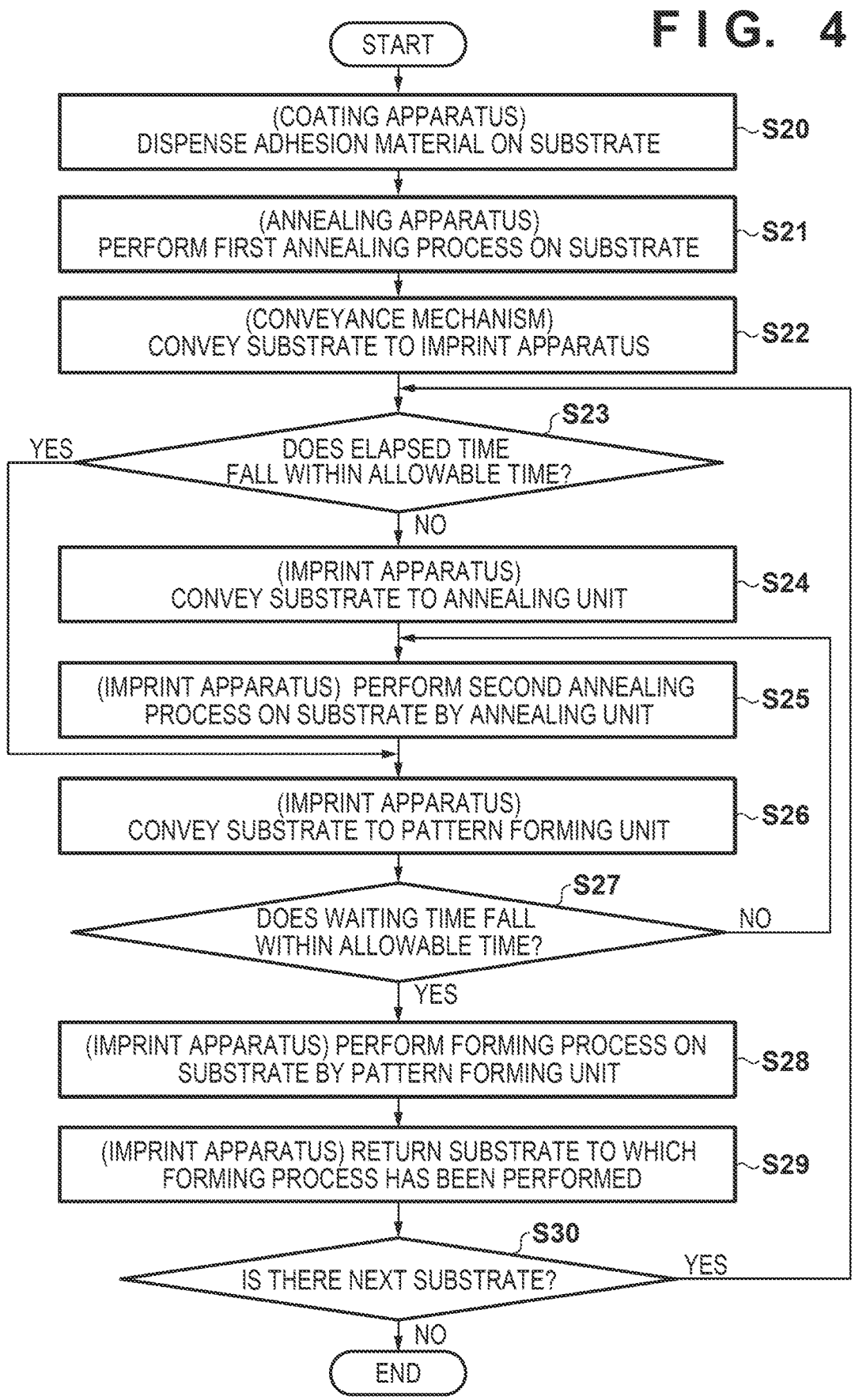
FIG. 4 is a flowchart showing an imprint method according to the second embodiment.

The imprint method of the imprint system according to this embodiment will be described below with reference to FIG. 4. FIG. 4 is a flowchart showing the imprint method of the imprint system according to this embodiment.

Steps S20 to S22 are the same as steps S10 to S12 in the flowchart shown in FIG. 3. In step S20, a coating apparatus 10 dispenses an adhesion material on a substrate. In step S21, the annealing apparatus 20 performs the first annealing process on a substrate W that has been coated with the adhesion material by the coating apparatus 10. In step S22, the substrate W to which the first annealing process has been performed is conveyed by a conveyance mechanism to an imprint apparatus 30.

The processes of steps S23 to S30 are processes to be performed in the imprint apparatus 30 and can be controlled by, for example, a control unit 33.

In step S23, the control unit 33 determines, for the substrate W (target substrate W) that is a forming process target among the plurality of substrates W stored in a storage case F on a table 34, whether the elapsed time since the end of the first annealing process by the annealing apparatus 20 falls within an allowable time. The allowable time is the same as the allowable time of the above-described waiting time, and is, for example, the upper limit of the elapsed time in which the defect count of the imprint material pattern formed on the substrate can fall within an allowable range. The allowable time can be set in advance by performing an experiment or simulation.

If it is determined in step S23 that the elapsed time does not fall within the allowable range, the process advances to step S24. In step S24, the control unit 33 controls a conveyance unit 32 so that the target substrate W is conveyed to the annealing unit 35. In step S25, the control unit 33 controls the annealing unit 35 to perform the second annealing process on the target substrate W. Steps S24 and S25 are the same as steps S13 and S14 of the flowchart shown in FIG. 3, thus a detailed description thereof will be omitted. On the other hand, if it is determined that the elapsed time falls within the allowable range in step S23, the process advances to step S26. In this manner, in the imprint system according to this embodiment, the annealing unit 35 performs the second annealing process on the target substrate W only in a case in which the elapsed time since the end of the first annealing process does not fall within the allowable range.

In step S26, the control unit 33 controls the conveyance unit 32 to convey the target substrate W to a pattern forming unit 31 (onto a stage 31b). The processes of steps S27 to S29 are the same as those in steps S16 to S18 of the flowchart shown in FIG. 3. In step S30, the control unit 33 determines whether the substrate W (next substrate W) which is to perform the forming process next is present in the storage case F. If the next substrate W is present, the process advances to step S23, and the processes of steps S23 to S29 are performed on the next substrate W. At this time, the second annealing process (steps S23 to S25) of the next substrate W can be performed while the forming process is being performed on the preceding substrate W (target substrate W). On the other hand, if the next substrate W is not present, the process ends.

As described above, in the imprint system according to this embodiment, the annealing unit 35 performs the second annealing process on only the substrate for which the elapsed time since the end of the first annealing process by the annealing apparatus 20 does not fall within the allowable time. As a result, the throughput can be improved compared to that of the imprint system according to the first embodiment.

Third Embodiment

An imprint system according to the third embodiment of the present invention will be described. An imprint apparatus 30 of the imprint system according to this embodiment has an arrangement different from that of the imprint system 100 according to the first embodiment (second embodiment).

Figure 5:
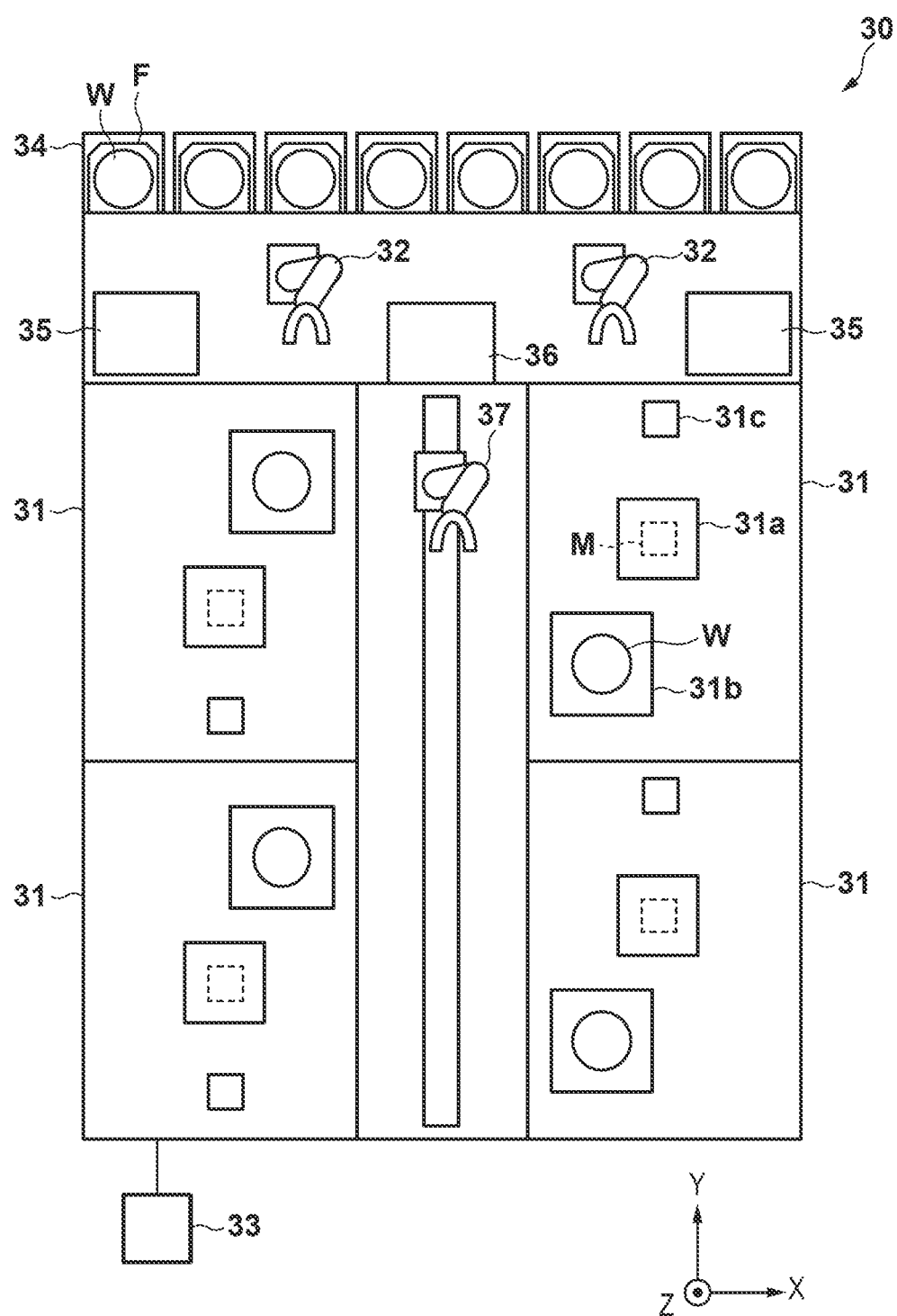
FIG. 5 is a schematic view showing the arrangement of an imprint apparatus according to the third embodiment.

An example of the arrangement of the imprint apparatus 30 of the imprint system according to this embodiment will be described below. FIG. 5 is a schematic view showing the arrangement of the imprint apparatus 30 according to this embodiment, and is a view in which the imprint apparatus 30 is viewed from above (Z-direction). A plurality of pattern forming units 31, a plurality of conveyance units 32, and a plurality of annealing unit 35 are arranged in the imprint apparatus 30 according to this embodiment. Four pattern forming units 31, two conveyance units 32, and two annealing units 35 are arranged in the example shown in FIG. 5. Also, eight tables 34 each of which is mounted with a storage case F, a relay portion 36 on which each substrate W is to be arranged when the substrate W is to be conveyed to a corresponding one of pattern forming units 31, and a second conveyance unit 37 that is to convey the substrate W to the corresponding one of the pattern forming units 31 from the relay portion 36 are arranged in the example shown in FIG. 5.

In the imprint apparatus 30 according to this embodiment, each substrate W to be conveyed to the pattern forming unit 31 is temporarily arranged in the relay portion 36 by the conveyance unit 32. The substrate W arranged on the relay portion 36 is conveyed to the corresponding one of the pattern forming units 31 by the second conveyance unit 37. A module that is arranged to convey each substrate W to the plurality of pattern forming unit 31 in this manner is also referred to as an EFEM (Equipment Front End Module). The imprint method described in the first embodiment or the second embodiment is also applicable to the imprint system that includes the imprint apparatus 30 arranged in this manner.

Fourth Embodiment

An imprint system 100A according to the fourth embodiment of the present invention will be described. The system arrangement of the imprint system 100A according to this embodiment is different from that of the imprint system 100 of the first embodiment (second embodiment), and a coating apparatus 10, an annealing apparatus 20, and an imprint apparatus 30 are connected in an inline manner.

Figure 6:
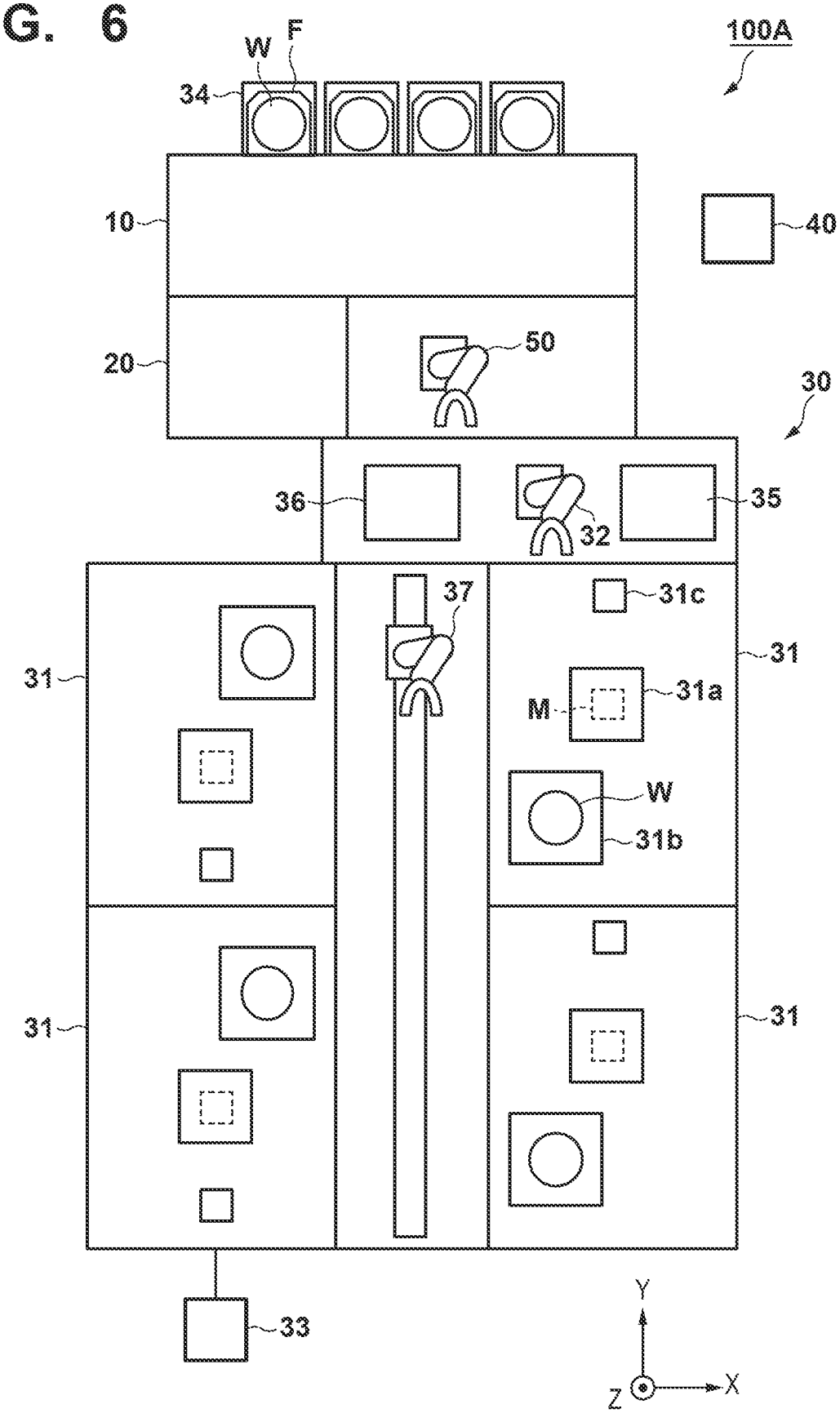
FIG. 6 is a schematic view showing the system arrangement of an imprint system according to the fourth embodiment.

FIG. 6 is a schematic view showing the system arrangement of the imprint system 100A according to this embodiment, and is a view in which the imprint system is viewed from above (Z-direction). In the imprint system 100A according to this embodiment, tables 34 are arranged on the coating apparatus 10. After a substrate W stored in a storage case F on each table 34 is conveyed to the coating apparatus 10 and is coated with an adhesion material, the substrate W is conveyed to the annealing apparatus 20 to perform the first annealing process. The substrate W to which the first annealing process has been performed is conveyed to a relay portion 36 of the imprint apparatus 30 by a conveyance robot 50 which serves as a conveyance mechanism. A plurality of (four in the example of FIG. 6) pattern forming units 31, an annealing unit 35, a conveyance unit 32, and a second conveyance unit 37 are arranged in the imprint apparatus 30. The conveyance unit 32 conveys the substrate W between the relay portion 36 and the annealing unit 35. The second conveyance unit 37 conveys the substrate W between the relay portion 36 and each pattern forming unit 31. The imprint method described in the first embodiment or the second embodiment is also applicable to the imprint system 100A that is arranged in this manner.

Fifth Embodiment

The fifth embodiment in which the present invention is applied will be described with reference to FIG. 7. In contrast to the method of transferring a pattern that has been drawn in advance on a mold (template) onto a wafer (substrate) such as that described in the above-described embodiments, a three-dimensional pattern is not drawn on a mold (planar template) in this embodiment. The underlying pattern that is formed on the wafer has a three-dimensional profile due to a pattern formed by a preceding process, and particularly in recent years, in accordance with the increase in the multilayered structure of memory elements, a process wafer that has a step of 100 nm more or less has appeared. A step that has been caused by mild warping of the entire wafer can be corrected by a focus following function of a scan exposure apparatus which is used in a photolithographic process, but a three-dimensional pattern with a fine pitch that falls within an exposure slit area of the exposure apparatus will directly consume the DOF (Depth Of Focus) of the exposure apparatus. As a conventional method of smoothing the wafer underlying pattern, methods that form a planarization layer such as SOC (Spin On Carbon) and CMP (Chemical Mechanical Polishing) are used. However, the conventional art is problematic in that it cannot obtain a sufficient planarization performance because the three-dimensional pattern suppression factor is 40% to 70% in a boundary portion between an isolated pattern area A and a repetitive dense (line and space density) pattern area B, such as that shown in reference numeral 71 in FIG. 7 (described below). Hence, the three-dimensional differences in the underlying pattern caused by multi-layering will tend to further increase in the future.

As a solution to this problem, U.S. Pat. No. 9,415,418 proposes a method of forming a contiguous film by dispensing, on a substrate, a resist that is to be a planarization layer by an inkjet dispenser and pressing the dispensed resist by a planar template. In addition, U.S. Pat. No. 8,394,282 proposes a method of reflecting a topographical measurement result on the wafer side onto the density information of each position that is to be designated for coating by the inkjet dispenser. In this embodiment, the present invention is applied to a planarization apparatus that performs local planarization on a wafer surface by pressing a planar template onto an uncured resist that has been dispensed in advance particularly.

Figure 7:
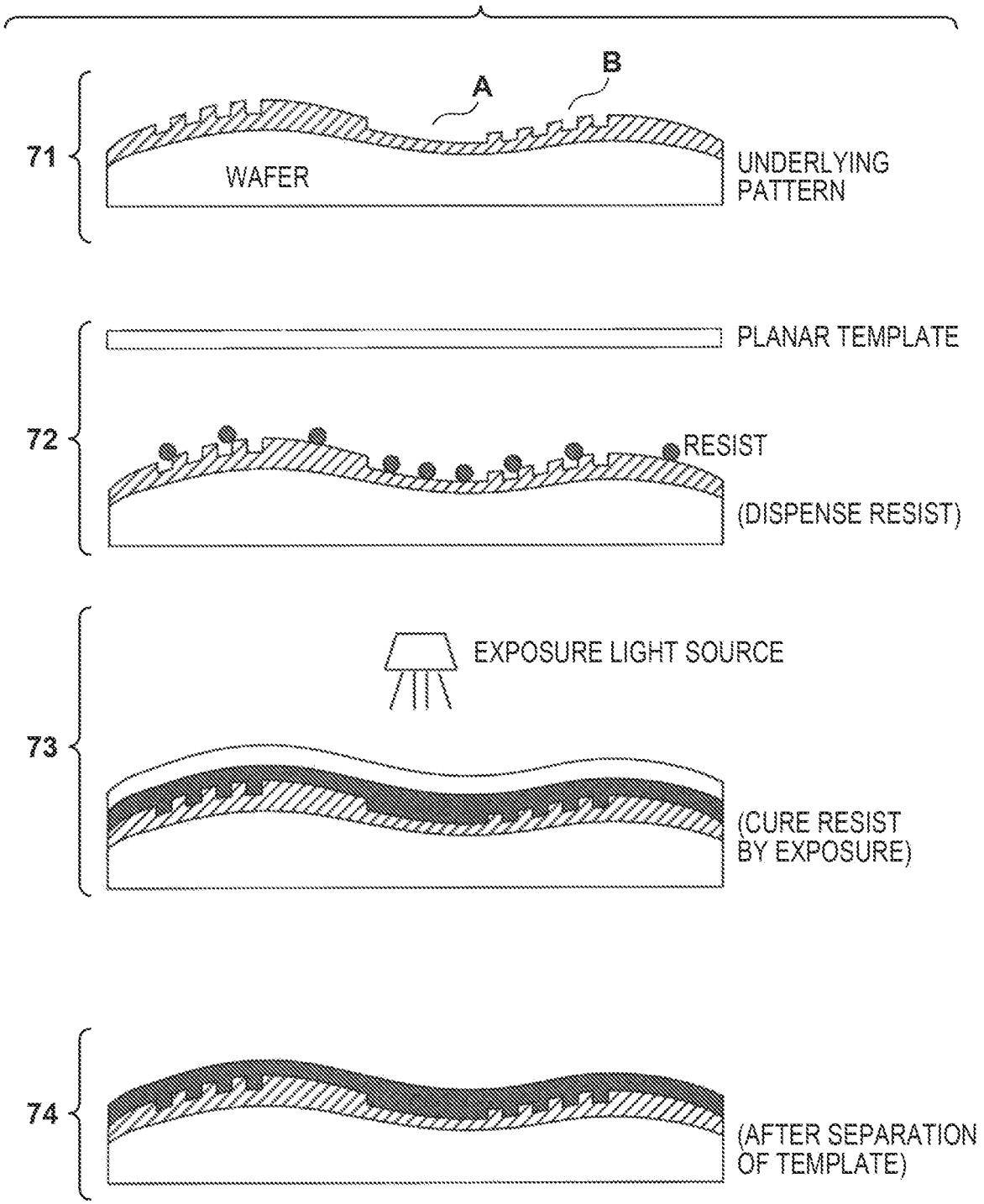
FIG. 7 is a view showing processes of planarization processing.

Reference numeral 71 of FIG. 7 indicates a wafer before planarization. The area of a pattern convex portion in the isolated pattern area A is small, and the dense area B has a 1:1 ratio of the area occupied by a pattern convex portion to the area occupied by a pattern concave portion. The value of the average height of the isolated pattern area A and the dense area B changes in accordance with the ratio occupied by the convex portions.

Reference numeral 72 of FIG. 7 is a view showing a state in which a resist that is to form a planarization layer has been dispensed on the wafer. Although this view shows a state in which the resist has been dispensed by the inkjet dispenser based on the known example of U.S. Pat. No. 9,415,418, the present invention is applicable even to a case in which a spin coater is used for resist coating. That is, the present invention is applicable as long as it includes a planarization process in which a planar template is pressed onto an uncured resist that has been dispensed in advance.

In reference numeral 73 of FIG. 7, the planar template is formed from glass or quartz that transmits ultraviolet light and is cured by irradiation with exposure light from an exposure light source. On the other hand, the planar template follows the profile of the wafer surface with respect to the mild concave-convex portions of the entire wafer.

In reference numeral 74 of FIG. 7, the planar template is separated after the resist is cured.

The present invention is applicable to the above-described fifth embodiment and obtains the same effect in the viewpoint of reducing adhesion layer contaminants as in the first to fourth embodiments.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing the article according to this embodiment includes a step of forming a pattern on an imprint material supplied (dispensed) onto a substrate by using the above-described imprint system (an imprint apparatus and an imprint method) and a step of processing the substrate, on which the pattern has been formed in the preceding step. This manufacturing method further includes other known steps (oxidation, deposition, vapor deposition, doping, planarization, etching, resist removal, dicing, bonding, packaging, and the like). The method of manufacturing the article according to this embodiment is superior to a conventional method in at least one of the performance, quality, productivity, and production cost of the article.

A pattern of a cured product molded using an imprint apparatus is used permanently for at least some of various articles or used temporarily when the various articles are manufactured. The article includes an electric circuit element, an optical element, a MEMS, a printing element, a sensor, a die, or the like. The electric circuit element includes, for example, a volatile or nonvolatile semiconductor memory such as a DRAM, an SRAM, a flash memory, or an MRAM or a semiconductor element such as an LSI, a CCD, an image sensor, or an FPGA. The die includes an imprinting mold or the like.

The pattern of the cured product is used without any change as a constituent member of at least part of the above-described article or used temporarily as a resist mask. The resist mask is removed after etching, ion implantation, or the like is performed in a processing step of the substrate.

A detailed method of manufacturing the article will now be described. As shown in reference numeral 81 of FIG. 8, a substrate 1z such as a silicon wafer having a processing target material 2z such as an insulator formed on its surface is prepared, and then an imprint material 3z is applied on the surface of the processing target material 2z by an inkjet method or the like. A state is shown here in which the imprint material 3z formed into a plurality of droplets is applied on the substrate.

Figure 8:
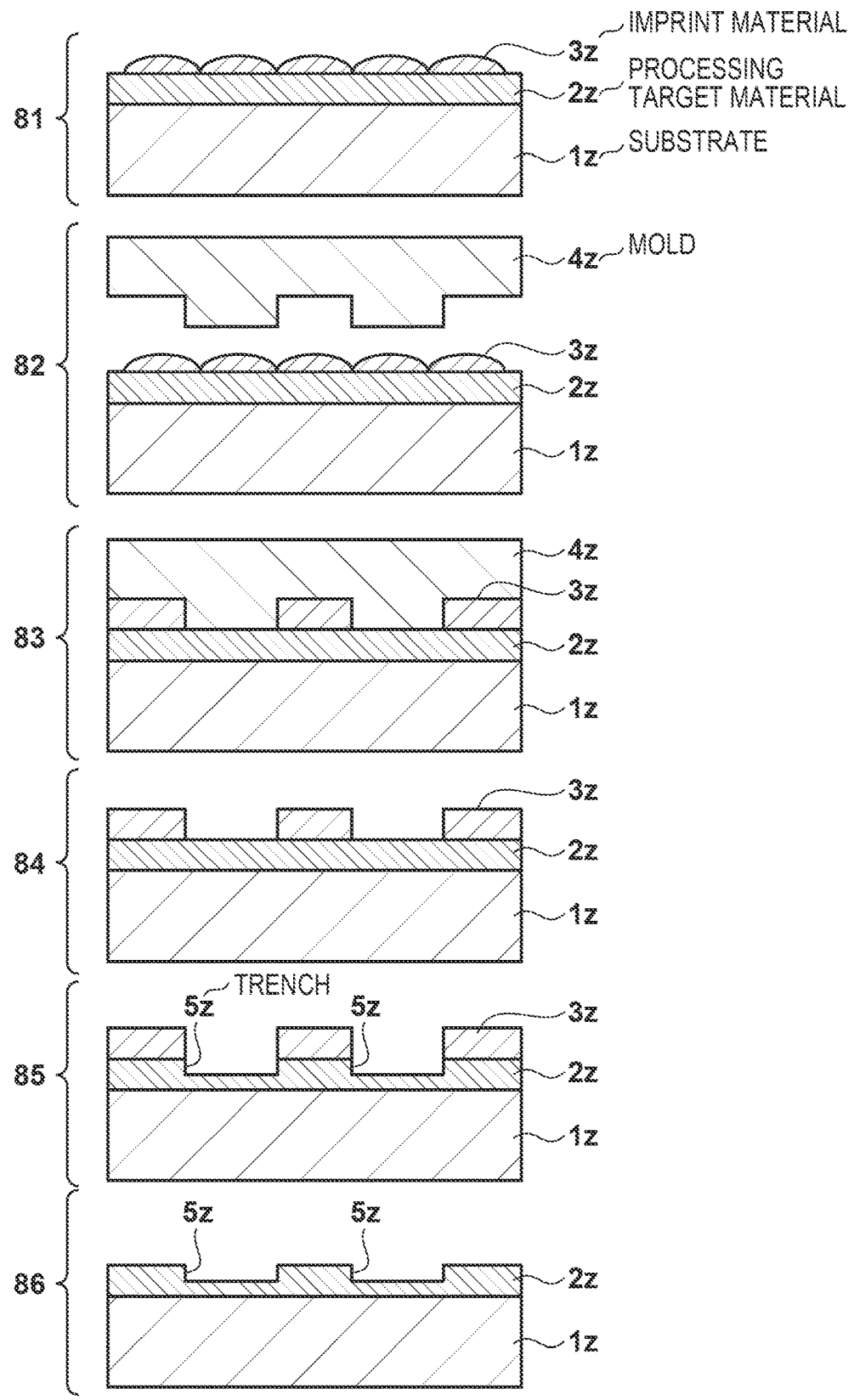
FIG. 8 is a view showing a method of manufacturing an article.

As shown in reference numeral 82 of FIG. 8, a side of the imprinting mold 4z on which its three-dimensional pattern is formed faces the imprint material 3z on the substrate. As shown in reference numeral 83 of FIG. 8, the mold 4z and the substrate 1z to which the imprint material 3z is applied are brought into contact with each other, applying a pressure. The imprint material 3z fills the gap between the mold 4z and the processing target material 2z. The imprint material 3z is cured by irradiating it with light as curing energy through the mold 4z in this state.

As shown in reference numeral 84 of FIG. 8, the pattern of the cured product of the imprint material 3z is formed on the substrate 1z by separating the mold 4z and the substrate 1z from each other after curing the imprint material 3z. The pattern of this cured product has a shape such that the concave portion of the mold corresponds to the convex portion of the cured product, and the convex portion of the mold corresponds to the concave portion of the cured product. That is, the three-dimensional pattern of the mold 4z is transferred to the imprint material 3z.

As shown in reference numeral 85 of FIG. 8, of the surface of the processing target material 2z, portions without the cured product or portions where the cured products remain thin are removed and become trenches 5z by performing etching using the pattern of the cured product as an etching resistant mask. As shown in reference numeral 86 of FIG. 8, an article having the trenches 5z formed on the surface of the processing target material 2z can be obtained by removing the pattern of the cured product. Although the pattern of the cured product is removed here, the pattern of the cured product may be utilized as, for example, an interlayer dielectric film included in the semiconductor element or the like, that is, a constituent member of the article without removing it even after processing.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2017-095845 filed on May 12, 2017, and 2018-052920 filed on Mar. 20, 2018, which are hereby incorporated by reference herein in their entirety.

What is claimed is:

1. A method of forming a layer of a curable composition on a substrate, the method comprising:
dispensing, on the substrate, an adhesion material to bring the substrate and the curable composition into tight contact with each other such that an adhesion layer consisting of the adhesion material containing a solvent is formed on the substrate;
performing a first process of heating the substrate on which the adhesion material has been dispensed such that the solvent contained in the adhesion layer is removed, and cooling the substrate;
conveying the substrate after the substrate has been subjected to the first process;
performing a second process of heating the substrate such that contaminants generated in the adhesion layer are sublimated to reduce the contaminants, and cooling the substrate, after the substrate has been subjected to the conveying;
supplying the curable composition on the formed adhesion layer after performing the second process; and
forming the layer of the curable composition on the adhesion layer using a template.

2. The method according to claim 1, wherein the second process includes controlling a starting timing of the second process on the substrate, based on a time at which the supplying of the curable composition is to be started, so that a waiting time from an end of the second process until a start of the supplying falls within an allowable time.

3. The method according to claim 2, wherein:
the supplying is performed on each of a plurality of substrates, and
the second process controls the start timing of the second process for each of the plurality of substrates so that the waiting time is the same for each of the plurality of substrates.

4. The method according to claim 2, wherein:
the supplying is performed on each of a plurality of substrates, and
for a substrate, among the plurality of substrates, where the waiting time does not fall within the allowable time, the substrate is again subjected to the second process.

5. The method according to claim 1, wherein the second process is different from the first process in at least one of a heating time or a heating temperature.

6. The method according to claim 1, wherein a heating time of the substrate in the second process is shorter than a heating time of the substrate in the first process.

7. The method according to claim 1, wherein each of the first process and the second process heats the substrate to not less than 60° C.

8. The method according to claim 1, wherein:
the first process is performed in a first device,
the second process is performed in a second device, and
the conveying conveys the substrate from the first device to the second device.

9. The method according to claim 8, wherein:
the forming of the layer is performed in a layer forming device of an apparatus, and
the second device is included in the apparatus and the first device is provided outside the apparatus.

10. The method according to claim 1, further comprising:
further conveying the substrate after the substrate has been subjected to the second process,
wherein the forming of the layer is performed after the substrate has been subjected to the further conveying.

11. The method according to claim 10, wherein:
the first process is performed in a first device,
the second process is performed in a second device,
the forming of the layer is performed in a layer forming device,
the conveying conveys the substrate from the first device to the second device, and
the further conveying conveys the substrate from the second device to the layer forming device.

12. The method according to claim 1, wherein the forming of the layer includes:
curing the curable composition in a state where the template and the curable composition are brought into contact with each other; and
then separating the template from the cured curable composition.

13. A method of manufacturing an article, the method comprising:
forming a layer of a curable composition on a substrate; and
processing the substrate, on which the layer of the curable composition has been formed, to manufacture the article,
wherein the forming of the layer includes:

dispensing, on the substrate, an adhesion material to bring the substrate and the curable composition into tight contact with each other such that an adhesion layer consisting of the adhesion material containing a solvent is formed on the substrate;

performing a first process of heating the substrate on which the adhesion material has been dispensed such that the solvent contained in the adhesion layer is removed, and cooling the substrate;

conveying the substrate after the substrate has been subjected to the first process;

performing a second process of heating the substrate such that contaminants generated in the adhesion layer are sublimated to reduce the contaminants, and cooling the substrate, after the substrate has been subjected to the conveying;

supplying the curable composition on the formed adhesion layer after performing the second process; and forming the layer of the curable composition on the adhesion layer using a template.

\* \* \* \* \*